US012633739B2

(12) United States Patent
Ratna et al.

(10) Patent No.: US 12,633,739 B2
(45) Date of Patent: May 19, 2026

(54) GLOBALLY IRREGULAR POWER GRID

(71) Applicant: Google LLC, Mountain View, CA (US)

(72) Inventors: Abhinav Ratna, Austin, TX (US);
Kam-Tou Sio, Zhupei City (TW); Raja Kumar Martha, Pleasanton, CA (US)

(73) Assignee: Google LLC, Mountain View, CA (US)

( * ) Notice: Subject to any disclaimer, the term of this patent is extended or adjusted under 35 U.S.C. 154(b) by 2 days.

(21) Appl. No.: 18/899,737

(22) Filed: Sep. 27, 2024

(65) Prior Publication Data
US 2026/0095044 A1     Apr. 2, 2026

(51) Int. Cl.
*H02J 1/00*          (2006.01)
*H03K 17/56*          (2006.01)
(52) U.S. Cl.
CPC ............... *H02J 1/00* (2013.01); *H03K 17/56* (2013.01); *H02J 2310/10* (2020.01)
(58) Field of Classification Search
CPC .................................. H02J 1/00; H03K 17/56
USPC ........................................................ 327/565
See application file for complete search history.

(56) References Cited

U.S. PATENT DOCUMENTS 11,083,071  B2 *   8/2021   Tetreault ........... H02J 13/00036
12,003,095  B2 *   6/2024   Hsu .......................... H02M 1/32
2025/0211143  A1 *   6/2025   Bucksch ................. H02P 6/085

* cited by examiner

*Primary Examiner* — Tomi Skibinski
(74) *Attorney, Agent, or Firm* — Fish & Richardson P.C.

(57) ABSTRACT

A method is described for determining power grid density on an integrated circuit. The method includes determining an initial placement of power switches, logic circuits, the power grid, and the logic grid. The method creates tiles covering the entire integrated circuit and assigns a power grid density and a logic grid density for each tile. Power losses are simulated for the entire chip and chip timing function is simulated. Based on the simulated power losses and the simulated chip timing, the power grid density and the logic grid density are adjusted on a per tile basis. The assignment of power grid density and logic grid density and simulations are iterated until a cessation condition is met. After the cessation condition is met, a final chip simulation is performed and the final routing is determined.

20 Claims, 10 Drawing Sheets

Irregular shape chip floorplan

500

505 — Place Logic & Power Switches

510 — Create Tiles

512 — Assign Power Grid to Tiles

514 — Simulate Power Losses

516 — Simulate Chip Timing Function

518 — Trim or Enhance Power Grid

Iterate

520 — Clock Tree Synthesis

530 — Routing Determination

GLOBALLY IRREGULAR POWER GRID

BACKGROUND

A power grid on an integrated circuit relies on metal lines to transfer electric power throughout the logic circuits. Using too much metal for the transferring of electric power (power routing resource) can adversely affect the performance of the integrated circuit by increasing the capacitance felt by the signal routing resource and thereby decreasing the maximum clock frequency. In addition, adverse effects to the integrated circuit may occur if there is over-heating or if too much power is drawn at one time. Using too little metal can increase the Ohm's Law (IR) losses in the power grid which can reduce the voltages applied to the logic circuits in different locations on the integrated circuit.

Some methods of power grid determination rely on a uniform spacing of the metal wires across the entire integrated circuit. Such methods are inefficient in that they may provide too much routing resource in certain locations and too little routing resource in other locations.

SUMMARY

This subject matter of this specification generally relates to power grid optimization in semiconductor devices. In particular, the subject matter of this specification relates to power grid design systems, methods, and procedures for optimization of the power grid placement to alleviate the above-mentioned issues. In particular, an irregular power grid can reduce timing delays and also reduce resistive losses.

In general, one innovative aspect of the subject matter described in this specification can be embodied in methods that include the actions of partitioning an integrated circuit design into a plurality of tiles, wherein: for each tile that includes within its boundaries a power switch, determining a width of the tile as a width of the power switch plus a first distance between adjacent power switches in a first direction, determining a length of the tile as a length of the power switch plus a second distance between adjacent power switches in a second direction perpendicular to the first direction, and centering the tile on the power switch; for each tile that does not include within its boundaries a power switch: determining a width of the tile in the first direction as half the width of the power switch plus the first distance, determining a length of the tile in the second direction as the length of the power switch plus the second distance, and placing the tile between a boundary of the integrated circuit and a tile which includes a power switch nearest the boundary of the integrated circuit; assigning a uniform power grid for each tile; for each tile, iteratively: determining a power parameter of a power grid within the tile, determining a timing metric of circuit elements of the integrated circuit, adjusting the power grid within each tile based on the determined power parameter and the determined timing metric; and repeating the iterations until a cessation condition is met. Other embodiments of this aspect include corresponding systems, apparatus, and computer programs, configured to perform the actions of the methods, encoded on computer storage devices.

The subject matter described in this specification can be implemented in particular embodiments to realize one or more of the following advantages. Optimization of a power grid in an integrated circuit can improve the processing speed of the logic circuits in the integrated circuit. Optimization of the power grid can also enhance circuit reliability and lifetime by avoiding hotspots and minimizing electro-migration of material on the metal portions of the integrated circuit.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

The methods and techniques described here optimize the amount of metal allocated to signals and the amount of metal allocated to the power grid by dividing the entire IC into tiles and optimizing the power grid routing resource per tile, taking into account the underlying logic circuits of that tile and also of the possibility of including additional metal or removing metal from that tile. In this manner the IR losses may be traded off for performance (e.g., clock frequency) of the logic circuits.

The partitioning of the IC into tiles can, in some implementations, assume a uniform placement of power switches in a grid across the entire integrated circuit. The tiles are, in some implementations, rectangles, with a size dependent on whether the tile encompasses a power switch. Depending on the fabrication process, however, other tile geometries can also be use, e.g., hexagonal, triangular, etc.

Each tile has its own power grid routing resource for distributing the power to the circuit elements of the IC and a signal routing resource for the transfer of the signals among the various circuit elements. The design process begins with an initial condition for the IC that the power grid is uniformly distributed within each tile. Because of the irregular area of the entire IC, there may be some portions of the IC which are further from a power switch than other portions. For instance, near the edge of a non-rectangular IC, there may be some regions which are further than average from a power switch and these regions may be optimized with a different routing resource than, for example, the routing resource for tiles further in the interior of the IC.

The entire circuit is simulated to determine the losses related to power consumption (e.g., IR losses and voltage droop) and also how the routing resource affects processing performance (e.g., changes in total negative skew, changes in total negative slack, changes in clock frequency). If, for example, a tile has large IR losses, then additional power grid may be added to that tile. If IR losses are small and the timing metric is worse than a baseline value, then the power grid may be trimmed from that tile. The entire IC is also simulated for timing to confirm that the IC will perform as expected and meet the timing metrics required. If the IC fails to meet the timing metric, the power grid is adjusted—trimmed or expanded-accordingly. In general, as more power grid is added, the IR losses decrease but the timing metrics also become worse. As the power grid is trimmed, the timing metrics improve but the IR losses also get worse. By iterating this procedure over each tile and over the entire IC, a more optimal distribution of the routing resource/power grid relative to a uniform power grid can be determined.

These features and additional features are described in more detail below.

Figure 1:
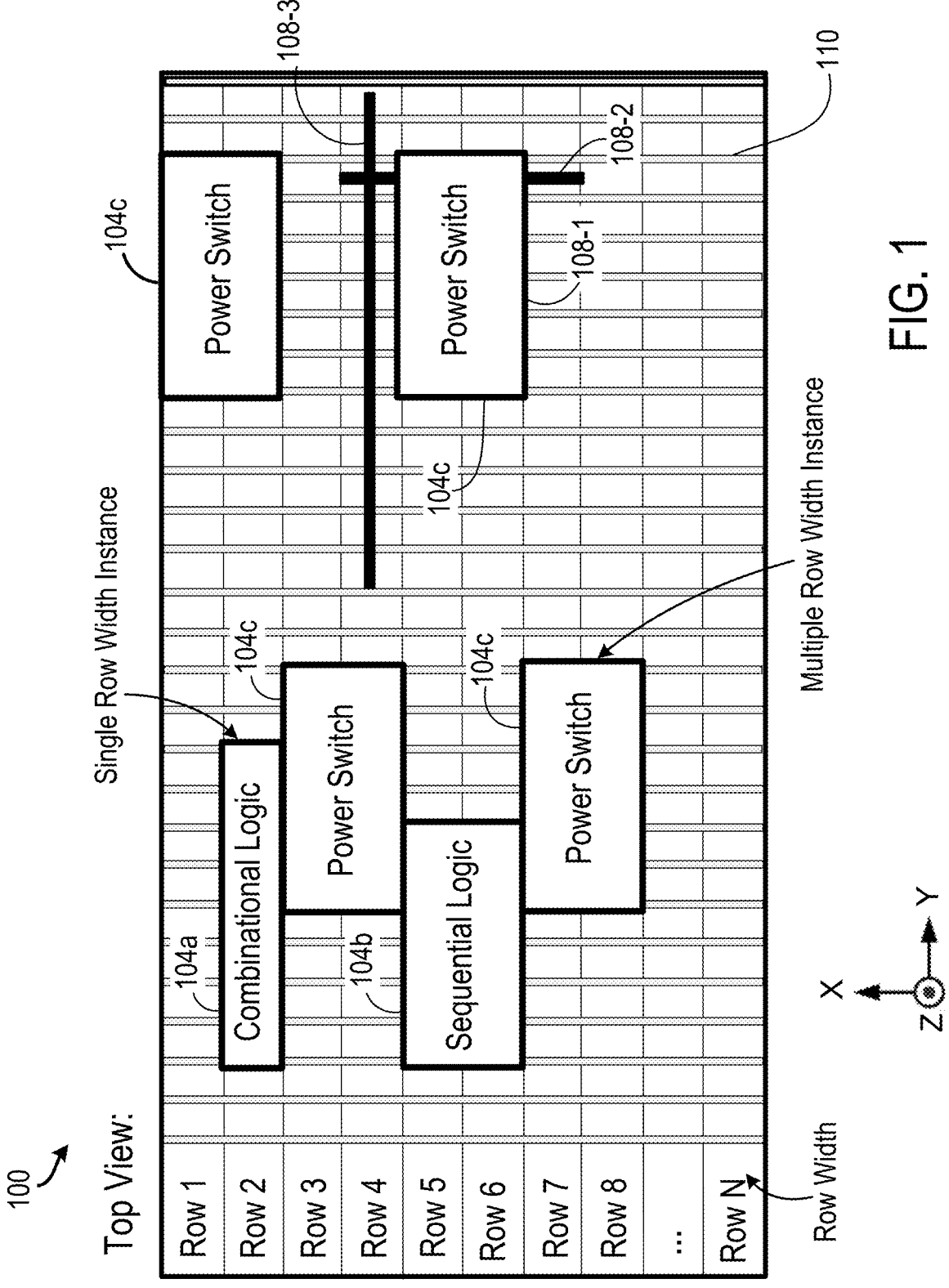
FIG. 1. illustrates an example semiconductor device having a power grid in a top-down view.
Figure 2:
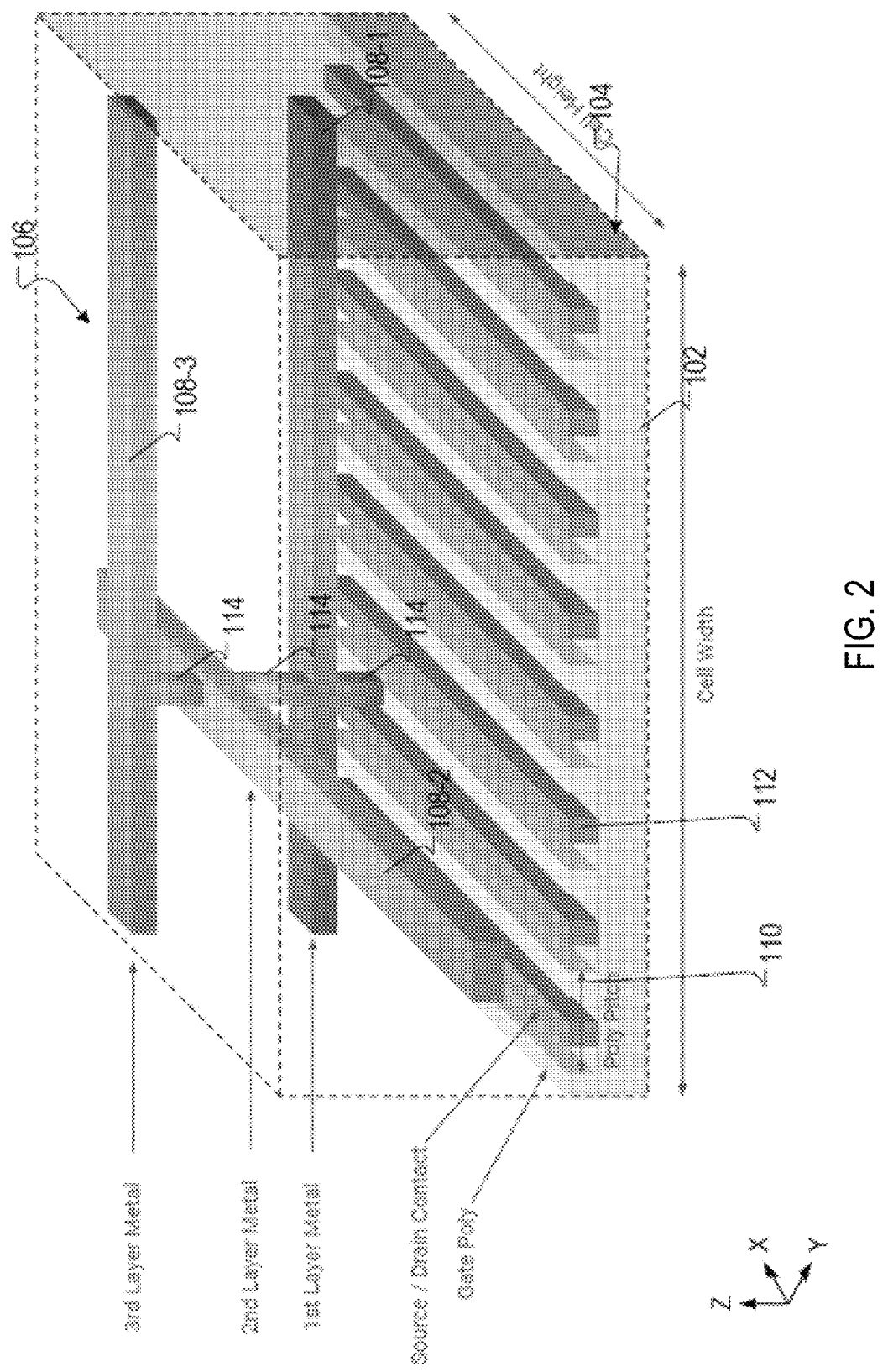
FIG. 2. illustrates an example semiconductor device having a power grid in a perspective view.
Figure 3:
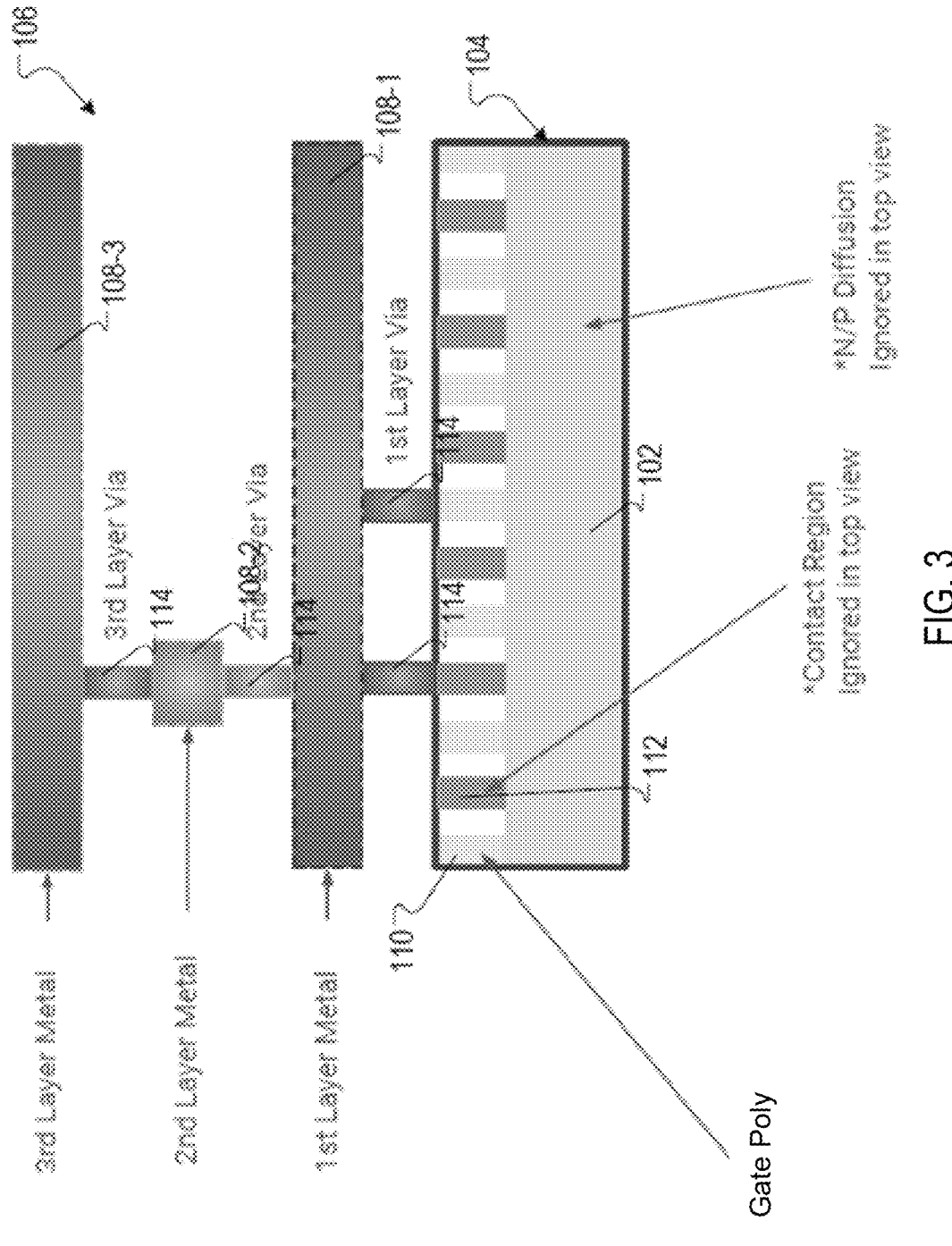
FIG. 3. illustrates an example semiconductor device having a power grid in a cross-sectional view.

FIG. 1 illustrates an example semiconductor device 100 having a power grid. FIG. 1 illustrates a top view of the semiconductor device 100. FIGS. 2-3 illustrate a perspective view and a side view of a cell of the semiconductor device 100, respectively. The X, Y, and Z axes (also referred to as X, Y, and Z directions) are included in FIGS. 1-3 to further illustrate the spatial relationship of various components in the semiconductor device 100.

A substrate (e.g., substrate 102) of the semiconductor device can include two lateral surfaces extending laterally in the X-Y plane: a top surface on the top side of the substrate on which a component of the semiconductor device can be formed, and a bottom surface on the bottom side opposite to the front side of the substrate, and disposed from the top surface in the Z direction. The Z direction is perpendicular to both the X and Y directions. As used in this specification, whether one component (e.g., a layer or a device) is "on," "above," or "below" another component (e.g., a layer or a device) of the semiconductor device is determined relative to the substrate of the semiconductor device in the Z direction (the vertical direction perpendicular to the X-Y plane, e.g., the thickness direction of the substrate) when the substrate is positioned in the lowest plane of the semiconductor device in the Z direction. The same notion for describing the spatial relationships is applied throughout the specification.

The semiconductor device 100 can have the substrate 102 (as shown in FIGS. 2-3) on which various circuits 104 (such as combinational logic 104a, sequential logic 104b, and power switches 104c as shown in FIG. 1) are formed. Each of these circuits 104 can be referred to as a cell and can include transistors formed using suitable techniques such as complementary metal-oxide-semiconductor (CMOS), field effect transistor (FET) techniques, fin field effect transistor (FinFET) techniques, and gate-all-around (GAA) transistors, etc. In some implementations, the transistors of the cells 104 are arranged in an array and have gates 110 and source/drain contacts 112. The gates 110 and the contacts 112 can extend in a first horizontal direction (e.g., the X direction). In some instances, the gates 110 are made of a conductive material such as metal or polysilicon. As shown in FIG. 1, the semiconductor device 100 has a plurality of cell placement rows, e.g., rows Row1 . . . . RowN, and each cell 104 may occupy one or more rows along the X direction. Each cell placement row extends, for example, in a second horizontal direction (e.g., the Y direction) perpendicular to the first horizontal direction.

The power grid 106 of the semiconductor device 100 is coupled to the cells 104 and is configured to transmit power to the cells 104. For example, the power can be provided by an external power source coupled to the cells 104 by the power grid 106. The power grid 106 can include a plurality of metal layers 108 spaced along a vertical direction (e.g., the Z direction) perpendicular to both the first horizontal direction (e.g., the X direction) and the second horizontal direction (e.g., the Y direction). For example, as shown in FIGS. 1-3, the metal layers 108 can include a first metal layer 108-1 coupled to the cell 104, a second metal layer 108-2 being above and coupled to the first metal layer 108-1, and a third metal layer 108-3 being above and coupled to the second metal layer 108-2. In an example, the first metal layer 108-1 and the third metal layer 108-3 extend in the Y direction. In an example, the second metal layer 108-2 extends in the X direction. While the example structure of FIG. 2 has been described, other metal layer configurations can also be used, depending on the integrated circuit.

The power grid 106 further includes vias 114 connecting adjacent metal layers and/or connecting a metal layer (e.g., the first metal layer 108-1) to the cell 104. As shown in FIGS. 2-3, the vias 114 extend in the Z direction. Again, while three metal layers are shown in FIGS. 1-3, this example is merely for illustration purposes. In practice, the semiconductor device 100 can have any suitable number of metal layers in the power grid 106.

Figure 4:
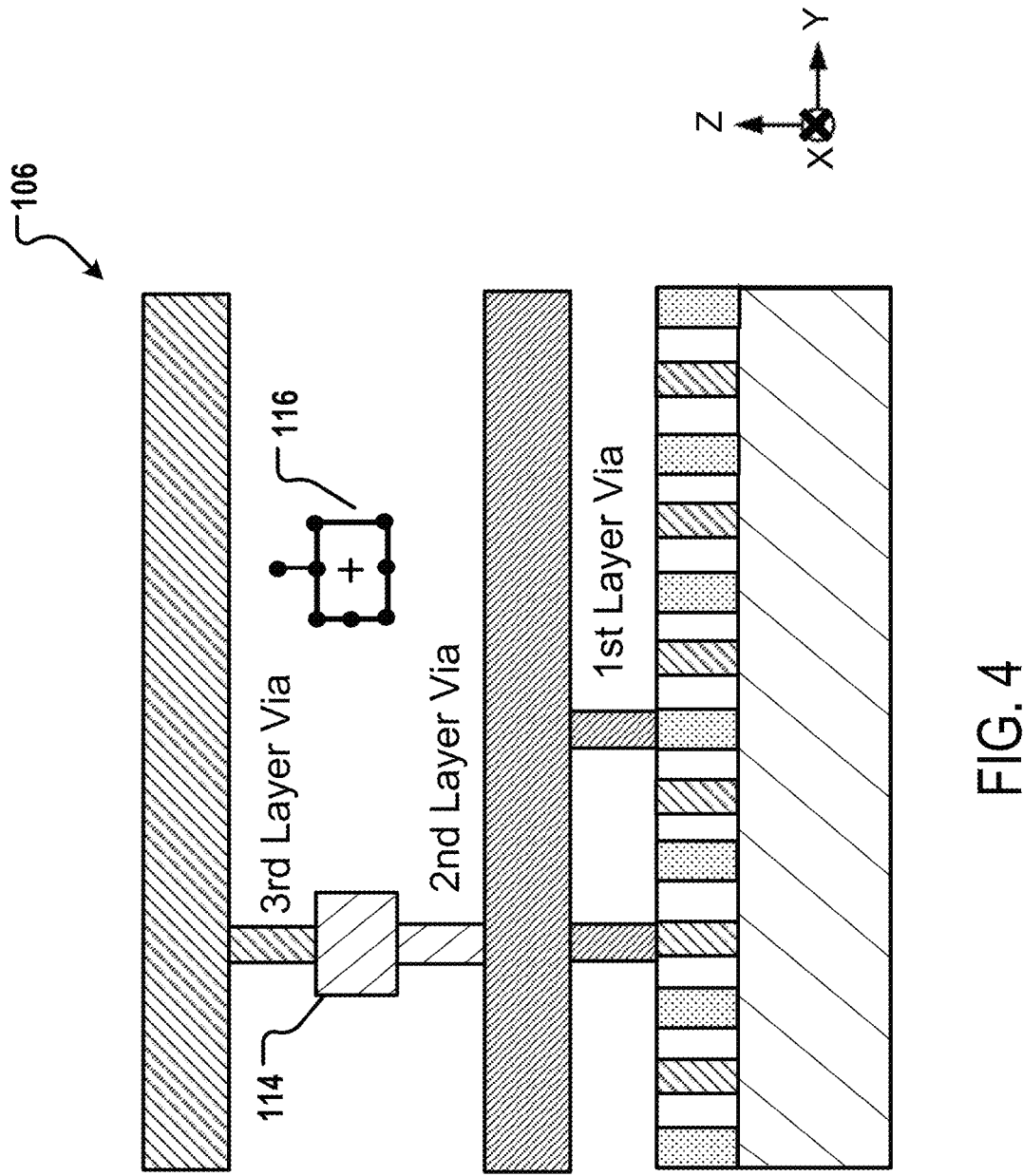
FIGS. 4-6 illustrate additional metal layers in a cross-sectional view of the semiconductor device.
Figure 5:
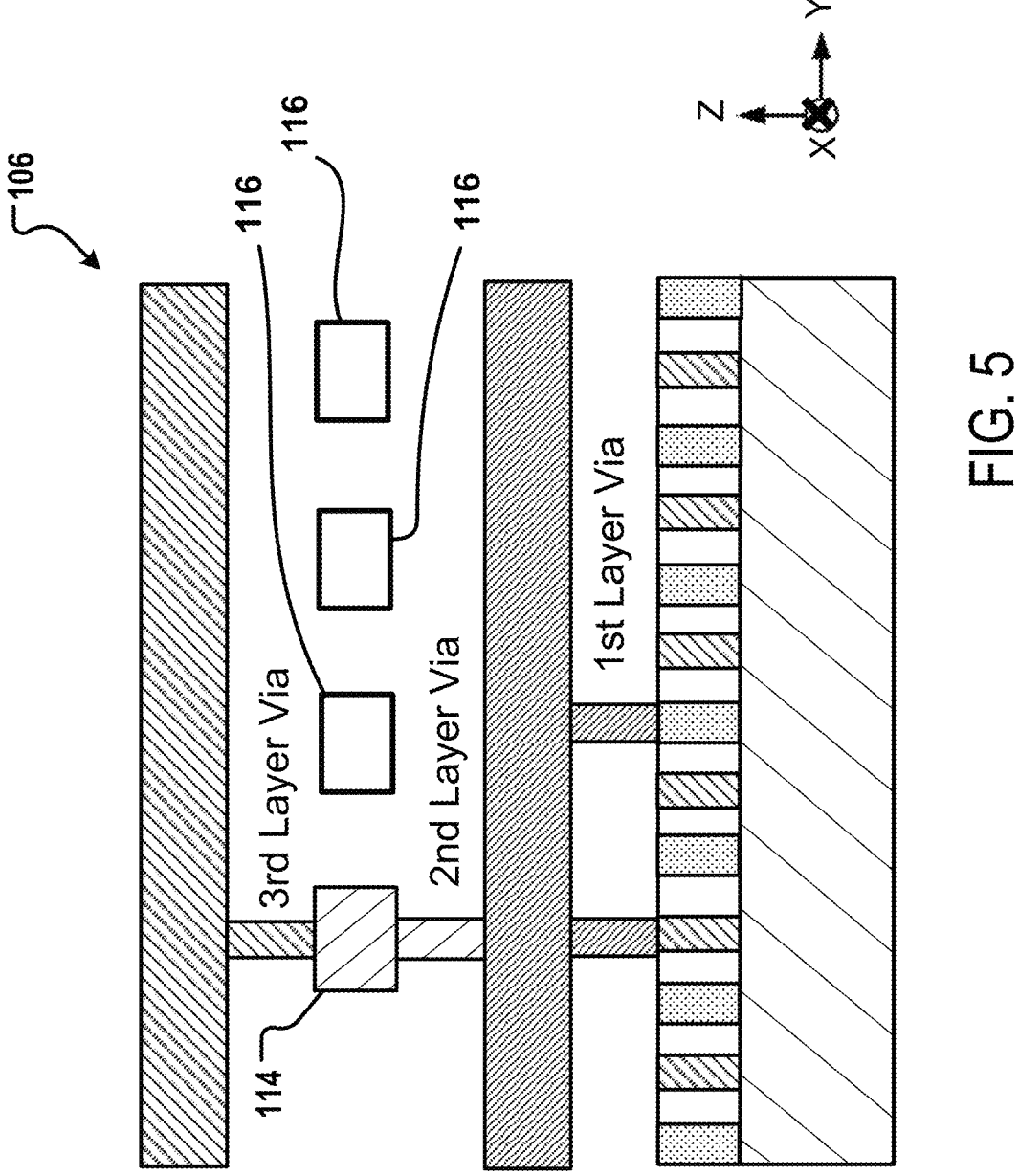
Figure 6:
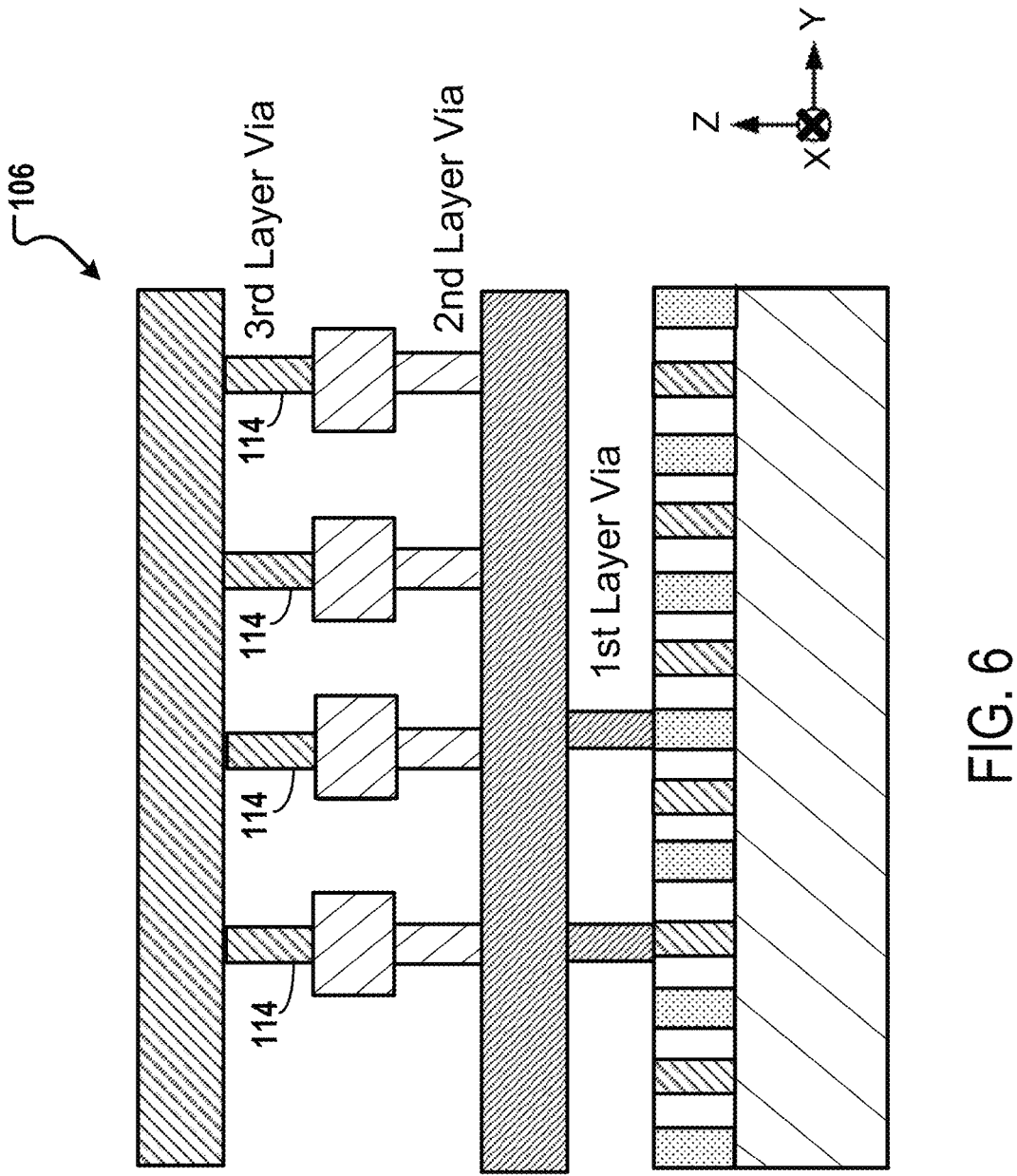

FIGS. 4-6 illustrate additional metal layers in a cross-sectional view of the semiconductor device 100. FIG. 4 shows the power grid 106 and also a signal carrying metal 116. In an example, the signal carrying metal 116 is disposed away from the power grid via 114 at the same height above the substrate so that there is low capacitance between the signal carrying metal 116 and the power grid 106, especially the via 114. In this example, the power grid 106 and the signal carrying metal 116 are both relatively low density.

In FIG. 5, there are multiple signal carrying metals 116 at the same level as the power grid via 114. In this example, because the signal carrying metals 116 are close to each other (and also close to the power grid 106), there is a greater capacitance amongst the signal carrying metals 116 and also between the signal carrying metals 116 and the power grid 106. Thus, in such a situation with a high density of signal carrying metals 116, IC performance may be subject to parasitic capacitances not present in in the configuration of FIG. 4.

FIG. 6 illustrates an example of a higher density power grid 106 by the inclusion of additional vias 114. In this example, with much more routing resource devoted to the power grid 106, the IR losses may be much lower, but there also must be sufficient routing resource devoted to signal carrying metals 116 so as to avoid impacting IC performance.

Figure 7:
FIG. 7 illustrates an example tile partitioning given a placement of power switches.
Figure 7:
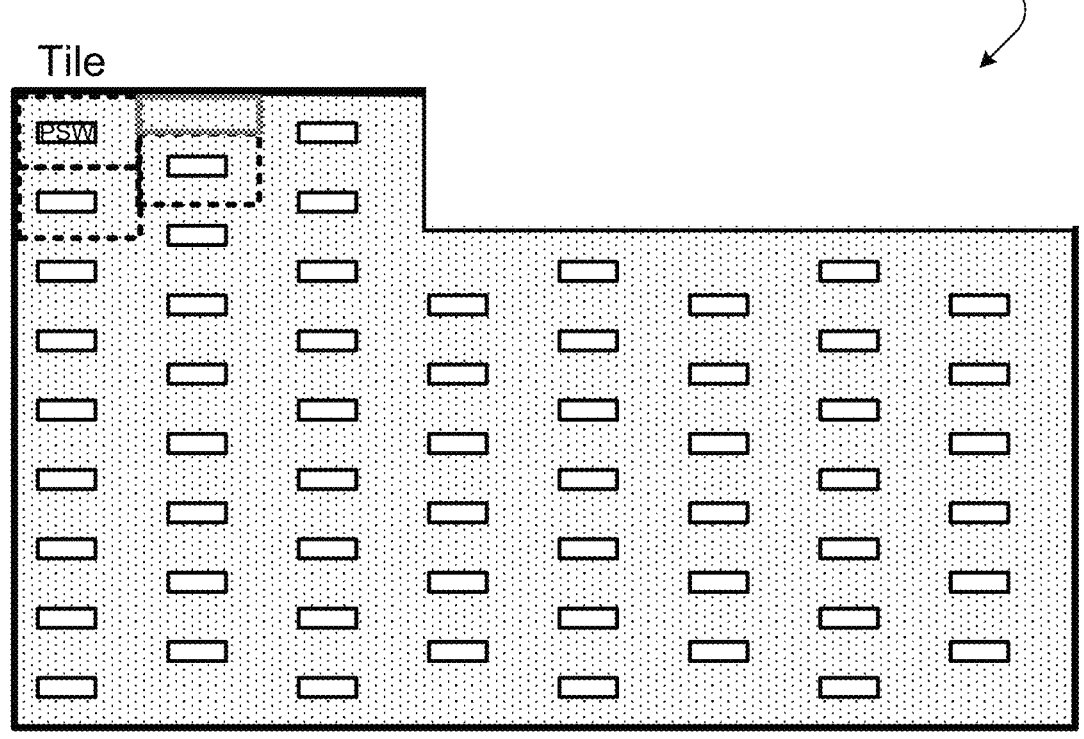
Figure 7:
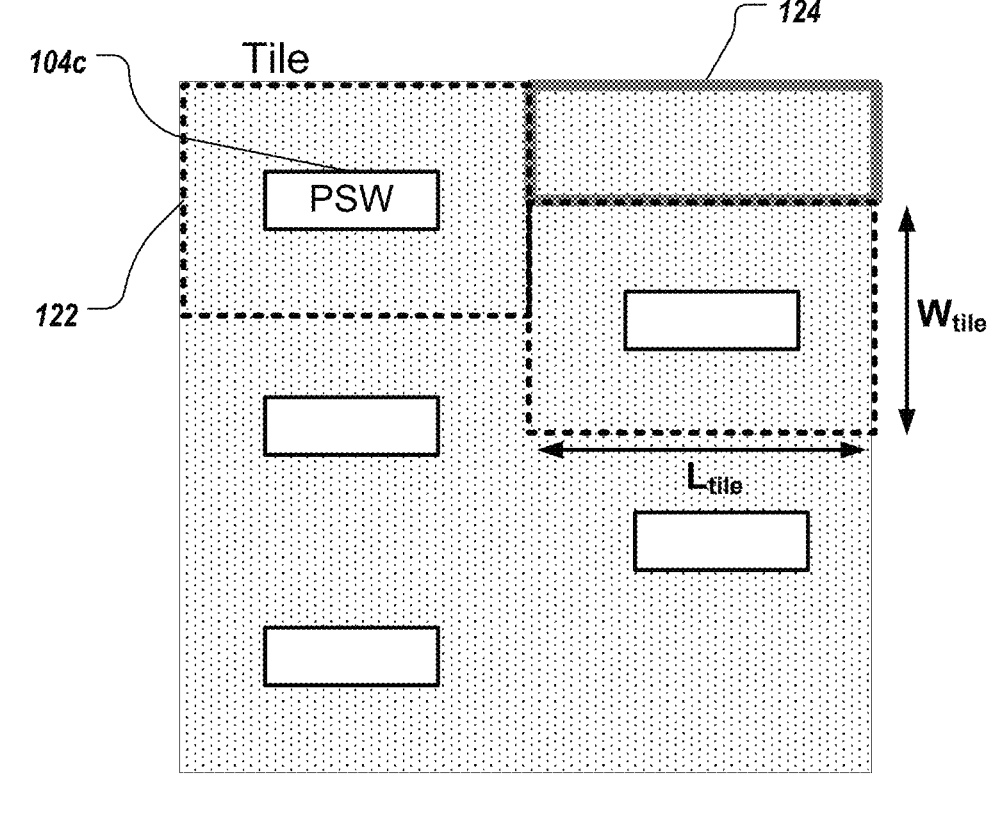

FIG. 7 illustrates an example tile partitioning given a placement of power switches in an integrated circuit design. In particular, FIG. 7 illustrates a floorplan of an irregularly shaped integrated circuit 100. As used in this specification, a "floorplan" specifies the locations of power switches 104c throughout the chip 100. In this example, the power switches 104c are spaced uniformly across the entire chip 100 in a lattice of regularly spaced columns in the Y-direction and staggered in the X-direction.

Typically, an IC may be uniform such that the floorplan is also uniform. However, in the example of FIG. 7, because of the staggering or because of the shape of the chip as a whole or due to other constraints, the irregularly shaped integrated circuit 100 is not formed as a single rectangle. For example, a first region of the floorplan may include only memory circuits and another region may encompass only a processor or other logic circuits. The amount of memory required by the processor may require that the memory rectangle and the processor rectangle take up two different areas with different dimensions. In such a situation the IC may have an irregular floorplan, as illustrated.

The floorplan may be partitioned into tiles which cover the entire floorplan. In this example, the tiles are of two types: a power switch tile 122 within which a power switch 104c is positioned, and a non-power switch tile 124 which has no power switch 104c inside it. In the example here, the non-power switch tiles are irregular edge tiles 124, but non-power switch tiles can be located elsewhere, depending on the design specification. For the remainder of this description, the non-power switch tile 124 will be referred to as an edge tile 124. For case of illustration, the power switch tiles 122 are shown with power switches 104 centrally positioned. However, in other implementations, the switches 104 can be positioned off center relative to the geometry of the tile within which it is placed. The entire set of power switches 104 so positioned in the chip is referred to as a lattice of power switches. In the example illustrated the lattice is a rectangular lattice but other lattices (e.g., triangular or hexagonal) may also be used.

The entire floorplan of the chip 100 can be covered by a combination of power switch tiles 122 and edge tiles 124 without any tiles overlapping each other. The power switch tiles 122 may have a length in the Y direction ($L_{tile}$) and a width in the X direction ($W_{tile}$). The power switch tiles 122 may cover the bulk of the chip 100 and the remaining portion of the chip 100 is taken up the edge tiles 124. The dimensions of the power switch tiles 122 are determined by the X-pitch and the Y-pitch of the lattice of the power switches and also by the size of the power switches 104c. In the example shown in FIG. 7, the power switches 104c form the lattice that provides a nearly uniform distance to a power switch 104c anywhere in the integrated circuit 100. The edge tiles 124 have one length to match the power switch tiles 124 and a second length to accommodate the edge of the IC 100 itself. In the example of FIG. 7, the edge tile 124 has the same length in the Y-direction as the power switch tile ($L_{tile}$), but the width in the X-direction is one half the width of the power switch tile ($W_{tile}$).

Figure 8:
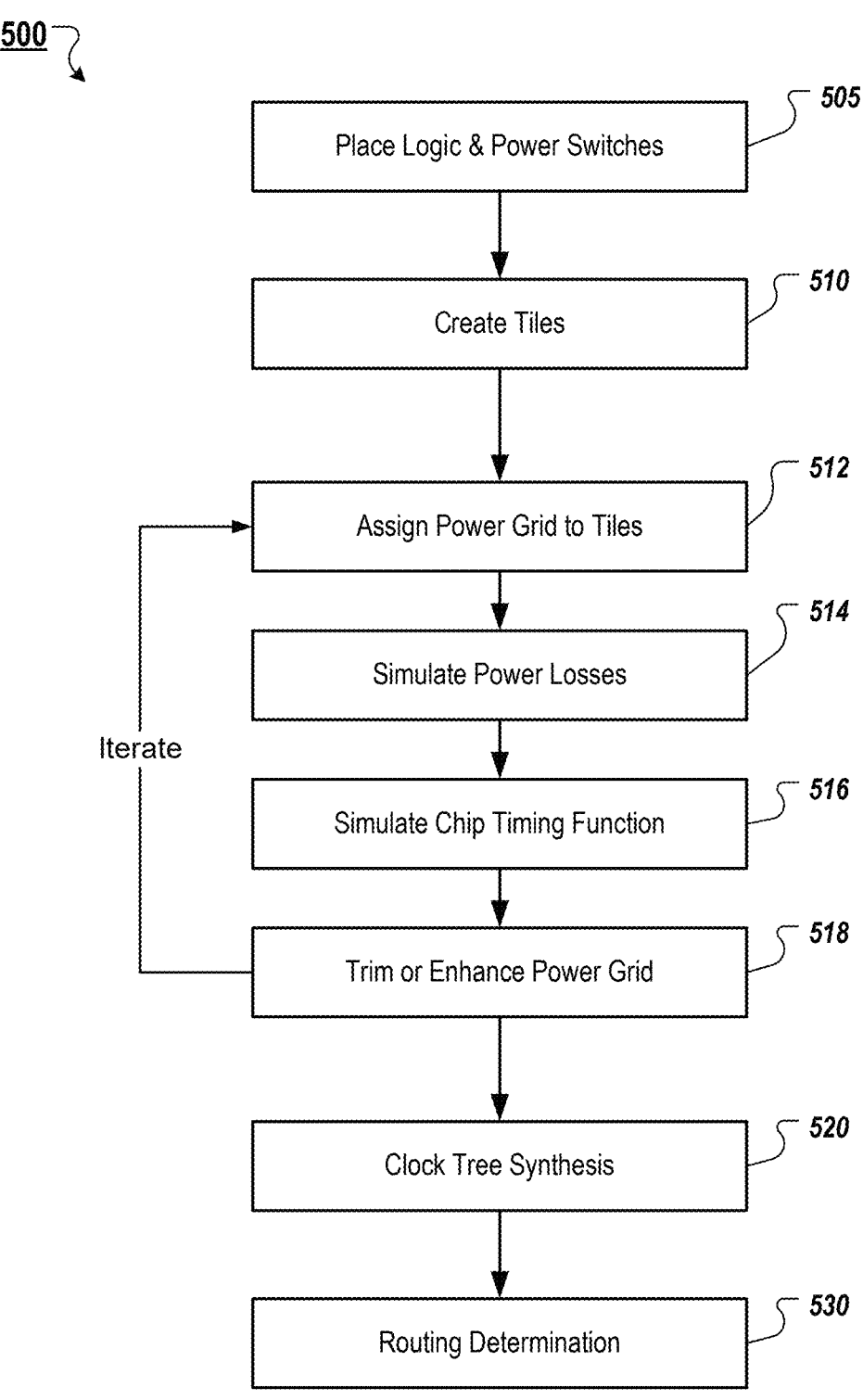
FIG. 8 is a flow diagram of an example process for power grid optimization.

FIG. 8 is a flow diagram of an example process for power grid optimization. The process 500 may be performed by one or more computer devices executing instructions that cause the one or more computing devices to perform the processes described below.

The process 500 places the logic circuits and the power switching circuits across the chip (505). In an example, the initial placement of power switches 104c may be uniform across the chip. The power switches 104c may be placed in a lattice which provides uniform power switch coverage for the entire chip or nearly uniform save for a few edge locations. The process 500 may place the logic circuits and the power switching circuits, for example, according to a network list defining an integrated circuit, or based on other design data.

The process 500 partitions the integrated circuit design into tiles (510). The tiles include power switch tiles 122 and edge tiles 124 and are placed so as to cover the entire chip. The partitioning can be done based on the position of the power switches 104, and the dimensions of the tiles can be measured relative to the respective power switches 104.

The process 500 assigns a power grid on each tile (512), and then, for each tile, and iterative process is run.

An initial power grid configuration may assign the same baseline power grid density to each tile on the chip. As the method iterates back to this step, the power grid configuration may be changed for each tile based on the adjustments made at step 518, described in more detail below.

The process 500 simulates IR (heating) and electromigration (EM) and other power distribution losses for each tile (514). Simulation of power distribution losses may include estimating over-heating due to resistance of the power grid, calculating the effects of electromigration, voltage droop, and other parameters. In an example, a number of power electromigration line violations may be estimated and used to adjust the power grid density for each of the tiles. Simulation may be done using simulation software.

The process 500 performs a timing simulation for the entire chip given the placement of the logic circuits (e.g., combinational logic 104a or sequential logic 104b), the power switches, and the power grid for each tile (516). Timing simulations may include clock tree synthesis. Timing simulations may include simulating a total negative slack of the integrated circuit. As used herein, total negative slack is the aggregate of negative slack occurrences measured in a circuit. For example, if a specification requires a maximum delay of 100 ns for multiple channels, each channel with a delay in excess of 100 ns will contribute to the total negative slack. Thus, if three channels have delays of 105 ns, 106 ns, 110 ns, and all other channels have delays of 100 ns or less, the total negative slack is 21 ns.

Other timing metrics may include a clock frequency, a total negative slew, a worst negative slack, and similar parameters. Simulation may be done using simulation software.

The process 500, for each tile, adjusts the power grid based on the results of the power loss simulation and of the timing simulation (518). The adjustments can be made on one or more parameters. For example, if only the power loss simulation is taken into account, then Table 1 illustrates a possible change to the power grid which can be made.

TABLE 1

| Power Grid Change for Power Loss Simulation | | |
| --- | --- | --- |
| | IR losses Negative Result | IR losses Positive Result |
| Low PG density | Add PG | Do nothing |
| High PG density | Do nothing | Reduce PG |

In this example, if the power grid density is either low or high. The power grid density is "low" when the density is, for example, low relative to a baseline value, or at a minimum density, e.g., a minimum ampacity, number of parallel conductors, or cross sectional area required for the power grid. Conversely, the power grid density is "high" when the density is, for example, high relative to the baseline value, or at a maximum density, e.g., a maximum ampacity, number of parallel conductors, or cross sectional area required for the power grid. For a low power grid density, the density cannot be decreased further. Likewise, for a high power grid density, the density cannot be increased further.

When the power grid density is low, and when the power simulation loss indicates a negative result, e.g., IR losses are greater than a maximum allowed value, then additional wires or vias can be added to enhance the power grid, as indicated by the "Add PG" value. If the power simulation loss indicates a positive result, e.g., IR losses are less than a maximum allowed value, then the power grid need not be modified.

Conversely, when the power grid density is high, and when the power simulation loss indicates a negative result, then the system may determine that further optimization may not be available, so the power grid density cannot be increased, as indicated by the "Do Nothing" value. If the power simulation loss indicates a positive result, e.g., IR losses are less than a maximum allowed value, the power grid density can be reduced.

Table 2 illustrates another example, where timing is taken into account.

TABLE 2

| Power Grid Change for Timing Simulation | | |
| --- | --- | --- |
| | Timing simulation negative result | Timing simulation positive result |
| Low PG density | Add PG | Do nothing |
| High PG density | Do nothing | Reduce PG |

When the power grid density is low, and when the timing simulation loss indicates a negative result, e.g., the timing simulation indicates a delay or some other timing metric degradation that is greater than a maximum threshold, then addition wires or vias can be added to enhance the power grid, as indicated by the "Add PG" value. If the timing simulation loss indicates a positive result, e.g., the timing simulation indicates a delay or some other timing metric degradation that is less than a maximum threshold, then the power grid need not be modified.

Conversely, when the power grid density is high, and when the timing simulation loss indicates a negative result, then the system may determine that further optimization may not be available, as the power grid density cannot be increased, as indicated by the "Do Nothing" value. If the timing simulation loss indicates a positive result, then the power grid density can be reduced.

A design may take into account only IR losses or timing degradation. In other implementations, both may be considered. In some implementations, the simulation results for table 1 and table 2 are weighted. For example, if IR losses are considered more important than timing, then the IR losses may be weighted higher than timing degradation measurements when considering design factors. Conversely, if IR losses are considered less important than timing, then the IR losses may be weighted less than timing degradation measurements when considering design factors.

In another implementation, the IR losses and timing degradation may be evaluated as part of a truth table, such as shown in Table 3 below.

TABLE 3

| IR and Timing Factors for Power Grid Change | | | | |
| --- | --- | --- | --- | --- |
| | IR loss large | | IR loss small | |
| | Timing better | Timing worse | Timing better | Timing worse |
| Low PG density | Add PG | Do Nothing | Do Nothing | Do nothing |
| High PG density | Do Nothing | Reduce PG | Reduce PG | Reduce PG |

As indicated in Table 3 above, the state of the IR loss, timing degradation, and power grid density are used to determine whether to add to the power grid, decrease the power grid, or do nothing. For example, when the power grid density is low, and the IR loss is large, changes that result in less timing degradation can be implemented in the simulation by adding to the power grid. Conversely, if the IR loss is large, and changes to the power grid result in even poorer timing results, then no further changes can be made for the simulation.

On the other hand, when the power grid density is high, and the IR loss is small, changes that result in less timing degradation can be implemented while reducing the power grid density. Likewise, if the IR loss is small, and changes to the power grid result in poorer timing results, then the power grid density can also be reduced.

Similar design constraints are indicated for the situation in which the IR loss is large and the power grid density is high, and for when the IR loss is small and the power grid density is low.

Operations 512, 514, 516 and 518 may be iterated until a cessation condition is met. For example, after completing a specified number of iterations, the method may proceed to the next step. In another example, when simulated IR losses are below a certain threshold the iterations may cease. In another example, when a simulated timing parameter is below another threshold, the iterations may cease. In another example, the iterations continue until both a simulated IR loss is below a first threshold and a simulated timing parameter is below a second threshold. The iteration cessation conditions are not limited to these examples given here.

The process 500 performs a clock tree synthesis (520). The clock tree synthesis is a process to minimize routing resources for a clock while also distributing the clock as evenly as possible across the circuit.

In some implementations, power grid adjustments can again be performed after the clock tree synthesis is performed. In particular, steps 512, 514, 516 and 518 can again be iterated after performing the clock tree synthesis to determine any additional power grid density changes.

The process 500 performs a routing determination for the entire chip (530). The routing determination includes both the power grid determination for each tile and also the determination of the signal routing for the logic circuits. At this step, the different power grid densities determined for each tile may also necessitate a new determination of the signal routing.

Figure 9:
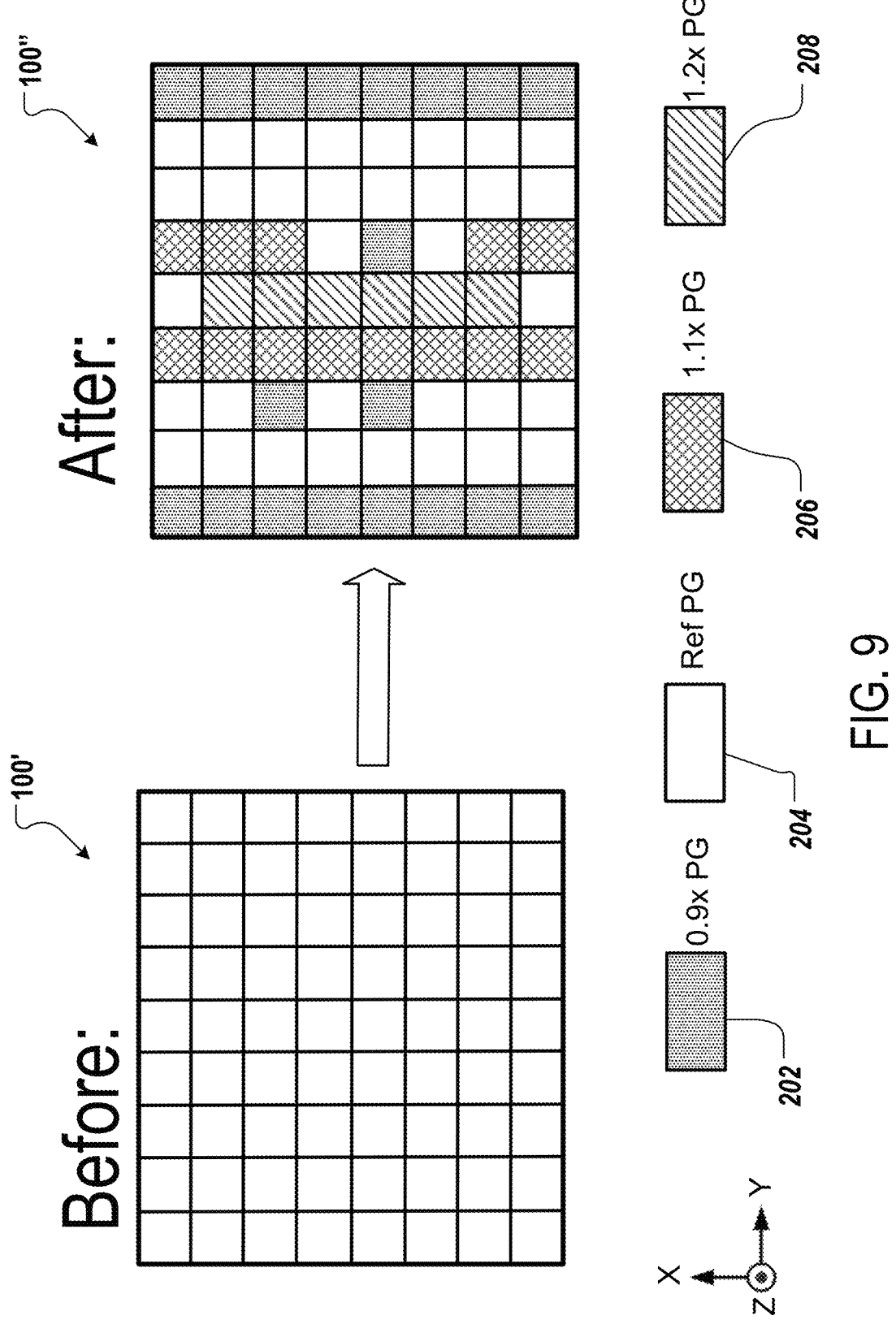
FIGS. 9 and 10 illustrates example results of the simulations and optimizations.
Figure 10:
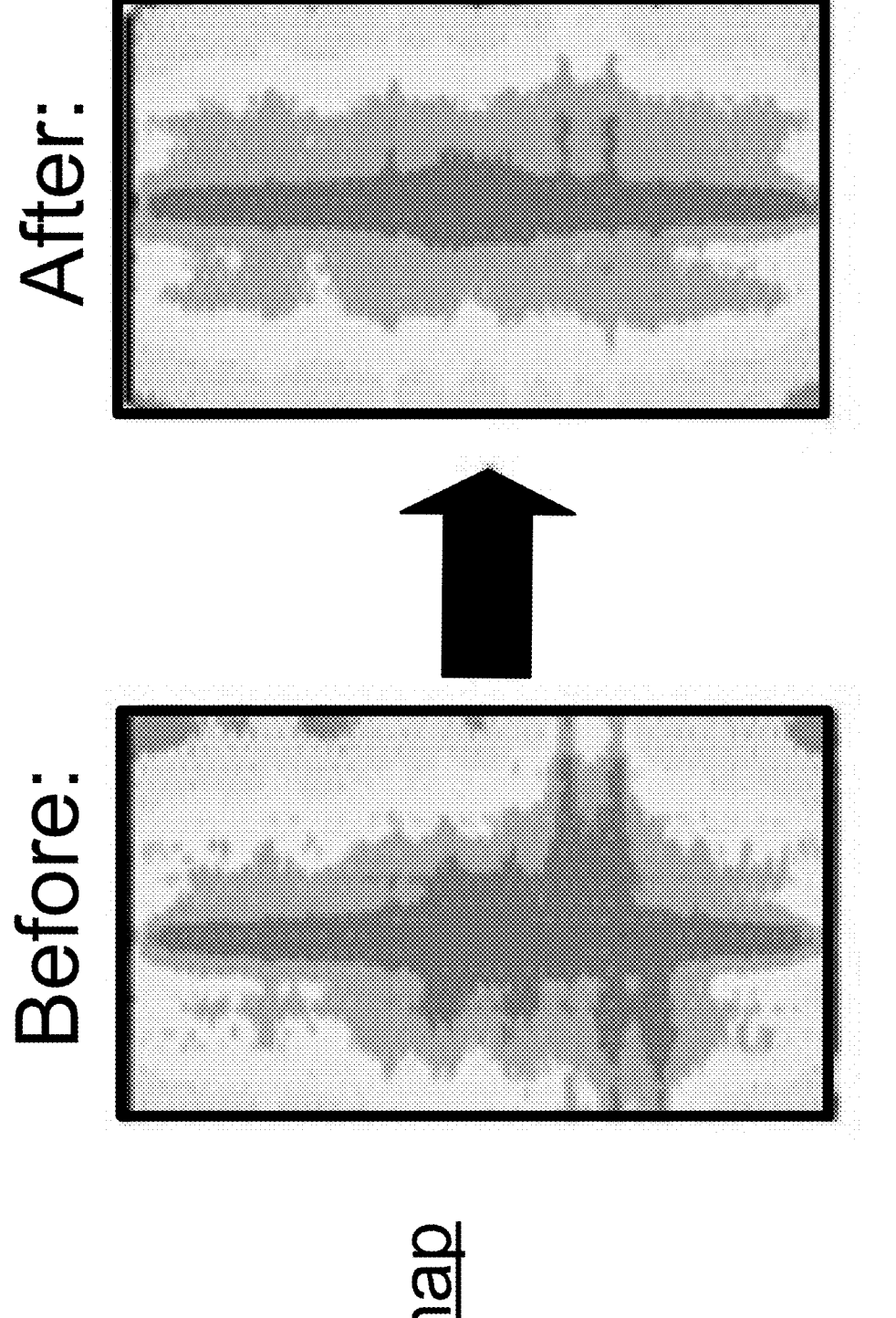

FIGS. 9 and 10 illustrates some example results of the simulations and optimizations. FIG. 9 illustrates power grid density of the integrated circuit 100' before applying the method and the integrated circuit 100" after applying the method. The before integrated circuit 100' has a uniform power grid density for every tile 122. In this example, for case of illustration, only power switch tiles 122 are shown, but expanding to include edge tiles 124 is straightforward. The density of the power grid for each tile is shown to be uniform for the before IC 100'. After application of the method the power grid density of the after IC 100" is no longer uniform for every tile but varies depending on the tile's location in the after IC 100". The tiles in this example have a power grid density which belongs to one of four categories: 90% of reference power grid density 202, the reference power grid density 204, 110% of reference power grid density 206, or 120% of reference power grid density 204. In this example, the tiles along the edges parallel to the X-axis belong to the 90% of reference density group 202. Tiles along the central axis parallel to the X axis and not on an edge of the after IC 100" belong to the 120% of reference density group 208. Some tiles adjacent to these center tiles belong to the 110% of reference density group 206. Some tiles adjacent the center tiles remain in the reference density group 202 or belong to the 90% of reference density group 202. One of the benefits of this technique is that it can improve chip 100 performance by providing additional power grid where it is needed to reduce IR losses while reducing power grid where the power grid may affect chip performance.

FIG. 10 illustrates an IR heatmap for a chip before and after application of the power grid optimization process. In this figure, the darker [red] regions indicate greater IR losses in that region. By re-optimizing the power grid density in each of the tiles and taking into account a timing parameter, the power grid density can be optimized. The before image indicates that a large area of the chip includes regions of greater IR loss which are in danger of overheating or affecting chip reliability or lifetime. The after image indicates that the areas most in danger of overheating are reduced. This reduction of regions in danger of overheating means that chip performance and reliability are improved.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

Apparatus to construct devices according to the processes described herein include semiconductor fabrication machine operable to perform the fabrication processes described herein. These include lithography machines, deposition tools, etchers, sputtering systems, dicing machines, linear guides, mask alignment tools, and other such machines and apparatus that can be configured to construct the devices realized the processes described herein. The methods, data processing apparatus and software described herein can be implemented to specify the above-described apparatus to perform functions and operations when constructing such semiconductor devices.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a user computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some embodiments, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A method for distributing a power grid for an integrated circuit, comprising:

partitioning an integrated circuit design into a plurality of tiles, wherein:

for each tile that includes within its boundaries a power switch:

determining a width of the tile as a width of the power switch plus a first distance between adjacent power switches in a first direction, determining a length of the tile as a length of the power switch plus a second distance between adjacent power switches in a second direction perpendicular to the first direction, and centering the tile on the power switch;

for each tile that does not include within its boundaries a power switch:

determining a width of the tile in the first direction as half the width of the power switch plus the first distance, determining a length of the tile in the second direction as the length of the power switch plus the second distance, and placing the tile between a boundary of the integrated circuit and a tile which includes a power switch nearest the boundary of the integrated circuit;

assigning a uniform power grid for each tile;

for each tile, iteratively:

determining a power parameter of a power grid within the tile;

determining a timing metric of circuit elements of the integrated circuit;

adjusting the power grid within each tile based on the determined power parameter and the determined timing metric; and repeating the iterations until a cessation condition is met.

2. The method of claim 1, further comprising:

performing a clock tree synthesis of the integrated circuit; and adjusting the power grid within each tile based on the clock tree synthesis.

3. The method of claim 1, wherein adjusting the power grid comprises:

based on the power parameter exceeding a first threshold value, increasing a power grid density;

based on the power parameter not exceeding the first threshold value, decreasing the power grid density or not changing the power grid density.

4. The method of claim 3, wherein the power parameter comprises at least one of a leakage power, a total power, an estimated number of electromigration-induced breaks, a static IR drop, or a dynamic IR drop.

5. The method of claim 3, wherein adjusting the power grid further comprises based on the timing metric exceeding a second threshold value, reducing the power grid density;

based on the timing metric not exceeding a second threshold value, increasing the power grid density or not changing the power grid density.

6. The method of claim 5, wherein the timing metric comprises at least one of a utilization rate, a maximum clock frequency, or a total negative slack.

7. The method of claim 1, further comprising:

performing a clock tree synthesis; and performing a route optimization for signal resources for the integrated circuit based on the clock tree synthesis.

8. A system, comprising:

a data processing apparatus; and a computer storage medium encoded with a computer program, the program comprising instructions that when executed by data processing apparatus cause the data processing apparatus to perform operations comprising:

partitioning an integrated circuit design into a plurality of tiles, wherein:

for each tile that includes within its boundaries a power switch:

determining a width of the tile as a width of the power switch plus a first distance between adjacent power switches in a first direction, determining a length of the tile as a length of the power switch plus a second distance between adjacent power switches in a second direction perpendicular to the first direction, and centering the tile on the power switch;

for each tile that does not include within its boundaries a power switch:

determining a width of the tile in the first direction as half the width of the power switch plus the first distance, determining a length of the tile in the second direction as the length of the power switch plus the second distance, and placing the tile between a boundary of the integrated circuit and a tile which includes a power switch nearest the boundary of the integrated circuit;

assigning a uniform power grid for each tile;

for each tile, iteratively:

determining a power parameter of a power grid within the tile;

determining a timing metric of circuit elements of the integrated circuit;

adjusting the power grid within each tile based on the determined power parameter and the determined timing metric; and repeating the iterations until a cessation condition is met.

9. The system of claim 8, the operations further comprising:

performing a clock tree synthesis of the integrated circuit; and adjusting the power grid within each tile based on the clock tree synthesis.

10. The system of claim 8, wherein adjusting the power grid comprises:

based on the power parameter exceeding a first threshold value, increasing a power grid density;

based on the power parameter not exceeding the first threshold value, decreasing the power grid density or not changing the power grid density.

11. The system of claim 10, wherein the power parameter comprises at least one of a leakage power, a total power, an estimated number of electromigration-induced breaks, a static IR drop, or a dynamic IR drop.

12. The system of claim 10, wherein adjusting the power grid further comprises based on the timing metric exceeding a second threshold value, reducing the power grid density;

based on the timing metric not exceeding a second threshold value, increasing the power grid density or not changing the power grid density.

13. The system of claim 12, wherein the timing metric comprises at least one of a utilization rate, a maximum clock frequency, or a total negative slack.

14. The system of claim 8, the operations further comprising:

performing a clock tree synthesis; and performing a route optimization for signal resources for the integrated circuit based on the clock tree synthesis.

15. A computer storage medium encoded with a computer program, the program comprising instructions that when executed by data processing apparatus cause the data processing apparatus to perform operations comprising:

partitioning an integrated circuit design into a plurality of tiles, wherein:

for each tile that includes within its boundaries a power switch:

determining a width of the tile as a width of the power switch plus a first distance between adjacent power switches in a first direction, determining a length of the tile as a length of the power switch plus a second distance between adjacent power switches in a second direction perpendicular to the first direction, and centering the tile on the power switch;

for each tile that does not include within its boundaries a power switch:

determining a width of the tile in the first direction as half the width of the power switch plus the first distance, determining a length of the tile in the second direction as the length of the power switch plus the second distance, and placing the tile between a boundary of the integrated circuit and a tile which includes a power switch nearest the boundary of the integrated circuit;

assigning a uniform power grid for each tile;

for each tile, iteratively:

determining a power parameter of a power grid within the tile;

determining a timing metric of circuit elements of the integrated circuit;

adjusting the power grid within each tile based on the determined power parameter and the determined timing metric; and repeating the iterations until a cessation condition is met.

16. The computer storage medium of claim 15, the operations further comprising:

performing a clock tree synthesis of the integrated circuit; and adjusting the power grid within each tile based on the clock tree synthesis.

17. The computer storage medium of claim 15, wherein adjusting the power grid comprises:

based on the power parameter exceeding a first threshold value, increasing a power grid density;

based on the power parameter not exceeding the first threshold value, decreasing the power grid density or not changing the power grid density.

18. The computer storage medium of claim 17, wherein the power parameter comprises at least one of a leakage power, a total power, an estimated number of electromigration-induced breaks, a static IR drop, or a dynamic IR drop.

19. The computer storage medium of claim 17, wherein adjusting the power grid further comprises based on the timing metric exceeding a second threshold value, reducing the power grid density;

based on the timing metric not exceeding a second threshold value, increasing the power grid density or not changing the power grid density.

20. The computer storage medium of claim 19, wherein the timing metric comprises at least one of a utilization rate, a maximum clock frequency, or a total negative slack.

\* \* \* \* \*